United States Patent
Sumi et al.

(10) Patent No.: US 9,190,601 B2
(45) Date of Patent: Nov. 17, 2015

(54) PIEZOELECTRIC MATERIAL, PIEZOELECTRIC ELEMENT, LIQUID EJECTING HEAD, LIQUID EJECTING APPARATUS, ULTRASONIC SENSOR, PIEZOELECTRIC MOTOR, AND POWER GENERATOR

(71) Applicant: Seiko Epson Corporation, Tokyo (JP)

(72) Inventors: Koji Sumi, Shiojiri (JP); Kazuya Kitada, Suwa (JP); Tomohiro Sakai, Matsumoto (JP); Yasuaki Hamada, Chino (JP); Tetsuya Isshiki, Shiojiri (JP); Satoshi Kimura, Fujimi (JP); Akio Ito, Matsumoto (JP); Tsuneo Handa, Shimosuwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/225,869

(22) Filed: Mar. 26, 2014

(65) Prior Publication Data

US 2015/0002584 A1  Jan. 1, 2015

(30) Foreign Application Priority Data

Jun. 28, 2013 (JP) .................................. 2013-137281
Jan. 8, 2014 (JP) .................................. 2014-001902

(51) Int. Cl.
*H01L 41/187* (2006.01)
*C04B 35/00* (2006.01)
(Continued)

(52) U.S. Cl.
CPC ................. *H01L 41/16* (2013.01); *B41J 2/045* (2013.01); *B41J 2/14233* (2013.01);
(Continued)

(58) Field of Classification Search
CPC ... H01L 41/187; H01L 41/87; H01L 41/0926; H01L 41/22; H01L 41/083; C04B 35/46; C04B 35/48; C04B 35/50; C04B 35/51; C04B 35/4682; C04B 35/468; C04B 35/495; C04B 2235/3206; C04B 2235/3215; C04B 2235/3251; H01G 4/1227
USPC .................. 310/358; 252/62.9; 501/134, 137
See application file for complete search history.

(56) References Cited

U.S. PATENT DOCUMENTS 5,637,542 A   6/1997   Takenaka
6,004,474 A  12/1999   Takenaka et al.
(Continued)

FOREIGN PATENT DOCUMENTS

CN   102531578 A   7/2012
JP   10-324569 A  12/1998
(Continued)

OTHER PUBLICATIONS

Extended European Search Report for Application No. EP 14 16 1855 dated Nov. 10, 2014 (8 pages).
(Continued)

*Primary Examiner* — Thomas Dougherty
(74) *Attorney, Agent, or Firm* — Harness, Dickey & Pierce, P.L.C.

(57) ABSTRACT

A piezoelectric material contains a first component that is a rhombohedral crystal that is configured to have a complex oxide with a perovskite structure and Curie temperature Tc1 and a second component that is a crystal other than a rhombohedral crystal that is configured to have a complex oxide with the perovskite structure and Curie temperature Tc2, in which |Tc1−Tc2| is equal to or less than 50° C.

23 Claims, 5 Drawing Sheets

(51) Int. Cl.
| | |
|---|---|
| *H01L 41/16* | (2006.01) |
| *B41J 2/14* | (2006.01) |
| *C04B 35/475* | (2006.01) |
| *C04B 35/495* | (2006.01) |
| *B41J 2/045* | (2006.01) |
| *G10K 9/122* | (2006.01) |
| *H01L 41/047* | (2006.01) |
| *H01L 41/08* | (2006.01) |
| *H02N 2/00* | (2006.01) |
| *H02N 2/18* | (2006.01) |

(52) U.S. Cl.
CPC ............ *C04B 35/475* (2013.01); *C04B 35/495* (2013.01); *G10K 9/122* (2013.01); *H01L 41/047* (2013.01); *H01L 41/08* (2013.01); *H01L 41/187* (2013.01); *H01L 41/1873* (2013.01); *H01L 41/1878* (2013.01); *H02N 2/001* (2013.01); *H02N 2/181* (2013.01)

(56) References Cited

U.S. PATENT DOCUMENTS

| | | | | |
|---|---|---|---|---|
| 7,279,823 | B2 | 10/2007 | Higuchi et al. | |
| 8,182,713 | B2 | 5/2012 | Xiaobing et al. | |
| 8,288,020 | B2 * | 10/2012 | Harigai et al. | 428/697 |
| 8,480,918 | B2 | 7/2013 | Miura et al. | |
| 8,882,246 | B2 | 11/2014 | Sakai | |
| 2002/0103433 | A1 | 8/2002 | Muramatsu et al. | |
| 2003/0001131 | A1 | 1/2003 | Takase et al. | |
| 2003/0134738 | A1 * | 7/2003 | Furukawa et al. | 501/135 |
| 2006/0015159 | A1 | 1/2006 | Flores et al. | |
| 2007/0008388 | A1 | 1/2007 | Yamaguchi et al. | |
| 2007/0189761 | A1 * | 8/2007 | Sudol | 396/316 |
| 2008/0265718 | A1 * | 10/2008 | Sakashita et al. | 310/358 |
| 2008/0278038 | A1 * | 11/2008 | Kobayashi et al. | 310/358 |
| 2008/0297005 | A1 * | 12/2008 | Sakashita et al. | 310/330 |
| 2008/0302658 | A1 * | 12/2008 | Sasaki et al. | 204/400 |
| 2009/0267998 | A1 * | 10/2009 | Sakashita et al. | 347/68 |
| 2011/0254899 | A1 | 10/2011 | Sakai | |
| 2011/0254901 | A1 | 10/2011 | Sakai | |
| 2012/0098386 | A1 | 4/2012 | Kounga Njiwa et al. | |
| 2012/0187325 | A1 | 7/2012 | Hoffmann et al. | |
| 2013/0136951 | A1 | 5/2013 | Harigai et al. | |
| 2014/0265729 | A1 | 9/2014 | Murakami et al. | |
| 2014/0339961 | A1 * | 11/2014 | Maejima et al. | 310/358 |
| 2015/0062257 | A1 * | 3/2015 | Masubuchi et al. | 347/72 |

FOREIGN PATENT DOCUMENTS

| | | |
|---|---|---|
| JP | 2002-220280 A | 8/2002 |
| JP | 2003-277143 A | 10/2003 |
| JP | 2003-289161 A | 10/2003 |
| JP | 2007-084408 A | 4/2007 |
| JP | 2009-001444 A | 1/2009 |
| JP | 2009-215111 A | 9/2009 |
| JP | 2011-181764 A | 9/2011 |
| JP | 2011-222884 A | 11/2011 |
| JP | 2012-139923 A | 7/2012 |
| JP | 2013-545697 A | 12/2013 |
| WO | WO-2012-044313 A1 | 4/2012 |
| WO | WO-2013-062120 A1 | 5/2013 |

OTHER PUBLICATIONS

M. Zou et al., "Microstructure and Electrical Properties of (1-x) [0.82$Bi_{0.5}Na_{0.5}TiO_3$—0.18$Bi_{0.5}K_{0.5}TiO_3$]—$xBiFeO_3$ Lead-Free Piezoelectric Ceramics", Journal of Alloys and Compounds, Elsevier Sequoia, Lausanne, CH, vol. 495, No. 1, Apr. 9, 2010, pp. 280-283.
Extended European Search Report for Application No. EP 14 16 1858 dated Nov. 3, 2014 (10 pages).

Y. Wu et al., "Lead-Free Piezoelectric Ceramics With Composition of (0.97-x)$Na_{1/2}Bi_{1/2}TiO_3$—0.03$NaNbO3$—$xBaTiO_3$", Journal of Materials Science, vol. 38, No. 5, Mar. 1, 2003, pp. 987-994.
J. Li et al., "Large Electrostrictive Strain in Lead-Free $Bi_{0.5}Na_{0.5}TiO_3$—$BaTiO_3$—$KNbO_3$ Ceramics", Applied Physics A; Materials Science & Processing, Springer, Berlin, DE, vol. 104, No. 1, Oct. 20, 2010, pp. 117-122.
H. Nagata et al., "Large Piezoelectric Constant and High Curie Temperature of Lead-Free Piezoelectric Ceramic Ternary System Based on Bismuth Sodium Titanate-Bismuth Potassium Titanate-Barium Titanate Near the Morphotropic Phase Boundary", Japanese Journal of Applied Physics, Japan Society of Applied Physics, JP, vol. 42, No. 12, Part 1, Dec. 1, 2003, pp. 7401-7403.
Extended European Search Report for Application No. EP 14 16 1857 dated Nov. 10, 2014 (8 pages).
A. Singh et al., "Structural and Electrical Properties of BKT Rich $Bi_{0.5}K_{0.5}TiO_3$—$K_{0.5}Na_{0.5}NbO_3$ System", AIP Advances, American Institute of Physics, 2 Huntington Quadrangle, Melville, NY 11747, vol. 3, No. 3, Mar. 15, 2013, pp. 32129-1, paragraph 1-pp. 32129-3, paragraph 2.
A. Sasaki et al., "Dielectric and Piezoelecric Properties of ($Bi_{0.5}Na_{0.5}$)$TiO_3$—($Bi_{0.5}K_{0.5}$)$TiO_3$ Systems", Japanese Journal of Applied Physics, vol. 38, No. 9B, Sep. 1, 1999, pp. 5564-5567.
Y. Hiruma et al., Phase Diagrams and Electrical Properties of ($Bi_{1/2}Na_{1/2}$)$TiO_3$—Based Solid Solutions, Journal of Applied Physics, American Institute of Physics, U.S., vol. 104, No. 12, Dec. 17, 208, pp. 124106/1-124106/7.
J. Yi et al., "The Role of Cation Vacancies on Microstructure and Piezoelectricity of Lanthanum-Substituted ($Na_{1/2}Bi_{1/2}$)$TiO_3$ Ceramics", Japanese Journal of Applied Physics, vol. 43, No. 9A, Sep. 1, 2004, pp. 6188-6192.
T. Karaki et al., "Lead-Free Piezoceramics with Vertical Morphotropic Phase Boundary", The 30th Conference on Applications of Ferroelectrics Program and Lecture Proceedings, May 22-25, 2013, p. 151 (25-P-20).
T. Wada et al., "$NaNbO_3$ Ferroelectric Ceramics", Extended Abstracts of The 64th Autumn Meeting No. 1, The Japan Society of Applied Physics, Aug. 30-Sep. 2, 2003, p. 141 (31a-YE-4).
Extended European Search Report for Application No. EP 14 16 1857 dated Jul. 23, 2015 (18 pages).
Hong-Qiang Wang et al., "Phase Transition Behavior and Electrical Properties of (1-x)$Bi_{0.5}Na_{0.5}TiO_3$-x($Na_{0.53}K_{0.44}Li_{0.04}$)($Nb_{0.88}Sb_{0.08}Ta_{0.04}$)$O_3$ Lead-Free Ceramics", Journal of the European Ceramic Society, Elsevier Science Publishers, Barking, Essex, GB, vol. 32, No. 8, Jan. 10, 2012, pp. 1481-1484.
L. Ramajo et al., "Influence of $MoO_3$ On Electrical and Microstructural Properties of ($K_{0.44}Na_{0.52}Li_{0.04}$)($Nb_{0.86}Ta_{0.10}Sb_{0.04}$)$O_3$", Applications of Ferroelectrics Held Jointly with 2012 European Conference on the Applications of Polar Dielectrics and 2012 International Symp Piezoresponse Force Microscopy and Nanoscale Phenomena in Polar Materials (ISAF/ECAPD/PFM), 2012 Intl. Symp., Jul. 9, 2012, pp. 1-4.
B. Wang et al., "Piezoelectric and Ferroelectric Properties of ($Bi_{1-x}Na_{0.8}K_{0.2}La_x$)$_{0.5}TiO_3$ Lead-Free Ceramics", Journal of Alloys and Compounds, vol. 526, Jun. 1, 2012, pp. 79-84.
V.R. Cooper et al., "LA-Driven Morphotrophic Phase Boundary in the $Bi(Zn_{frax;1;2}Ti_{frax;1;2})O_3$-$La(Zn_{frax;1;2}Ti_{frax;1;2})O_3$-$PbTiO_3$ Solid Solution", Chemistry of Materials, vol. 24, No. 22, Nov. 27, 2012, pp. 4477-4482.
C.C. Huang et al., "Phase Transitions and Dielectric Properties in $Bi(Zn_{frax;1;2}Ti_{frax;1;2})O_3$–$ABO^3$ Perovskite Solid Solutions", Applications of Ferroelectrics, 2008, ISAF 2008, 17th IEEE International Symposium on The, IEEE, Piscataway, NJ, USA, Feb. 23, 2008, pp. 1-3.
B.K. Barick et al., "Phase Transition and Electrical Properties of Lanthanum-Modified Sodium Bismuth Titanate", Materials Chemistry and Physics, Elsevier SA, Switzerland, Taiwan, Republic of China, vol. 132, No. 2, Dec. 21, 2011, pp. 1007-1014.

* cited by examiner

PIEZOELECTRIC MATERIAL, PIEZOELECTRIC ELEMENT, LIQUID EJECTING HEAD, LIQUID EJECTING APPARATUS, ULTRASONIC SENSOR, PIEZOELECTRIC MOTOR, AND POWER GENERATOR

BACKGROUND

1. Technical Field

The present invention relates to a piezoelectric material used in piezoelectric elements, or the like mounted in various devices such as actuators, ultrasonic devices such as ultrasonic oscillators, ultrasonic motors, pressure sensors, and pyroelectric elements such as IR sensors, a piezoelectric element using the material, a liquid ejecting head, a liquid ejecting apparatus, an ultrasonic sensor, a piezoelectric motor, and a power generator.

2. Related Art

A piezoelectric material, which is used as a piezoelectric layer (piezoelectric ceramics) constituting a piezoelectric element, or the like mounted in various devices such as actuators, ultrasonic devices such as ultrasonic oscillators, ultrasonic motors, pressure sensors, and pyroelectric elements such as IR sensors is required to have a remarkable piezoelectric characteristic, and as a representative example thereof, lead zirconate titanate (PZT) is exemplified.

However, from an environmental sensitivity point of view, a piezoelectric material whose lead content is suppressed is desired. As such a lead-free piezoelectric material, there are a piezoelectric material that includes an alkali metal such as $K_xNa_{(1-x)}NbO_3$, and $(Ba, Na)TiO_3$, a piezoelectric material such as $BiFeO_3$—$BaTiO_3$, and the like.

With regard to such a piezoelectric material, it is known that a remarkable piezoelectric characteristic can be obtained by using a composition near a Morphotropic Phase Boundary (MPB). However, in a phase diagram that employs compositions for the horizontal axis and temperatures for the vertical axis, the MPB line of PZT is substantially parallel to the temperature axis or positioned vertical to the composition axis, but an MPB line of a lead-free piezoelectric material is generally inclined with respect to the temperature axis (for example, refer to FIG. 1 of JP-A-2009-215111, or the like). When the MPB line is inclined as described above, even if a composition positioned on the MPB line at a specific temperature, for example, room temperature according to a desired characteristic is selected, it is set away from the MPB line on the composition-temperature state diagram when the environmental temperature changes, and thus, there is a problem in that there is a temperature area in which a piezoelectric characteristic, and dielectric characteristic of an element deteriorates due to changes in environmental temperature, generation of heat during usage, or the like.

Thus, from a desire that the MPB line is erect if possible in the phase diagram described above and a desire that a piezoelectric material has a remarkable piezoelectric characteristic and dielectric characteristic at around a normal temperature (room temperature) and can be used even at a temperature as high as possible, a piezoelectric material that has Curie temperature (Tc) as high as it can be, which is generally inversely proportional to the piezoelectric characteristic, has been demanded.

For this reason, technologies for improving temperature dependency by laminating a plurality of piezoelectric materials having different compositions have been proposed (refer to JP-A-2003-277143 and JPA-2011-181764), but the fact that the plurality of different piezoelectric materials should be used is a problem.

As described above, currently, there is no lead-free piezoelectric material compared to PZT, and thus, introduction of a lead-free piezoelectric material having a remarkable piezoelectric characteristic and dielectric characteristic in a wide use environment temperature range and having a high Curie temperature has been greatly desired.

Note that such a problem also arises not only in ink jet-type recording heads but also in other liquid ejecting heads that discharge droplets other than ink, and also arises even in piezoelectric elements used in devices other than such liquid ejecting heads.

SUMMARY

An advantage of some aspects of the invention is to provide a piezoelectric material that reduces the burden on the environment, and has a remarkable piezoelectric characteristic and dielectric characteristic in a wide use environment temperature range and has a high Curie temperature, a piezoelectric element using the material, a liquid ejecting head, a liquid ejecting apparatus, an ultrasonic sensor, a piezoelectric motor, and a power generator.

According to an aspect of the invention, there is provided a piezoelectric material containing a first component that is a rhombohedral crystal in a single composition and that is configured to have a complex oxide with a perovskite structure and Curie temperature is set to be Tc1 and a second component that is a crystal other than a rhombohedral crystal in a single composition and that is configured to have a complex oxide with the perovskite structure and Curie temperature is set to be Tc2, and in which the absolute value of the difference between Tc1 and Tc2|Tc1−Tc2| is equal to or lower than 50° C.

In this case, since the piezoelectric material does not contain lead, an environmental burden can be reduced, and the piezoelectric material that has a remarkable piezoelectric characteristic and dielectric characteristic in a wide use environment temperature range and has a high Curie temperature is produced.

Here, it is preferable that a composition near an MPB line be provided in a phase diagram that employs a composition ratio of a first component and a second component for the horizontal axis and temperature for the vertical axis. In this case, by selecting each component, the piezoelectric material that has a remarkable piezoelectric characteristic and dielectric characteristic in a use environment temperature range and has a high Curie temperature can be realized, in a wide composition range.

In addition, it is preferable that the relationship of |Tc1−Tc2|/|Tc1+Tc2|≤0.1 be satisfied. Accordingly, by further limiting the range of the absolute value of the difference between Tc1 and Tc2|Tc1−Tc2|, the piezoelectric material that has a remarkable piezoelectric characteristic and dielectric characteristic in a wide use environment temperature range and has a high Curie temperature can realized more reliably.

In addition, it is preferable that Curie temperature be equal to or higher than 280° C. In this case, the piezoelectric material that can be used in a wide use environment temperature range can be realized.

In addition, it is preferable that the molar ratio of the first component to (the first component+the second component) be equal to or higher than 0.1 and equal to or lower than 0.9. In this case, by thusly selecting each component, the piezoelectric material that has a remarkable piezoelectric characteristic and dielectric characteristic in a wide use environment temperature range and has a high Curie temperature can be realized in a wide composition range.

In addition, it is preferable that the first component be (Bi, Na, La)TiO$_3$, and the second component be NaNbO$_3$. In this case, a piezoelectric material that has a remarkable piezoelectric characteristic and dielectric characteristic in a wide use environment temperature range and has a high Curie temperature can be realized more reliably.

In addition, it is preferable that the first component be (Bi, Na, La)TiO$_3$, and the second component be (K, Na)NbO$_3$ to which at least one kind selected from Li and Ta is added. In this case, a piezoelectric material that has a remarkable piezoelectric characteristic and dielectric characteristic in a wide use environment temperature range and has a high Curie temperature can be realized more reliably.

In addition, it is preferable that the first component be (Bi, Na, La)TiO$_3$, and the second component be (Bi, K)TiO$_3$. In this case, a piezoelectric material that has a remarkable piezoelectric characteristic and dielectric characteristic in a wide use environment temperature range and has a high Curie temperature can be realized more reliably.

In addition, it is preferable that the first component be (Bi, Na, Ba)TiO$_3$, (Bi, Na)TiO$_3$, and one kind selected from (Bi, Na)TiO$_3$, (Bi, La)(Sc, Ti)O$_3$, and (Bi, La)(Zn, Ti)O$_3$ to which Ca is added, and the second component be NaNbO$_3$ to which at least one kind selected from Li and Ta is added. In this case, a piezoelectric material that has a remarkable piezoelectric characteristic and dielectric characteristic in a wide use environment temperature range and has a high Curie temperature can be realized more reliably.

According to another aspect of the invention, there is provided a piezoelectric element which includes a piezoelectric layer configured to have the piezoelectric material according to the aspect described above and an electrode provided on the piezoelectric layer.

In this case, since the piezoelectric element does not contain lead, an environmental burden can be reduced, and the piezoelectric material that can maintain excellent characteristics in a wide use environment temperature range can be realized.

In addition, according to still another aspect of the invention, there is provided a liquid ejecting head that includes a pressure generating chamber that communicates with a nozzle opening and a piezoelectric element that has a piezoelectric layer and an electrode provided on the piezoelectric layer, and the piezoelectric layer is formed of the piezoelectric material according to the above-described aspect.

In this case, since the piezoelectric element does not contain lead, an environmental burden can be reduced, and the liquid ejecting head that includes a piezoelectric element that can maintain excellent characteristics in a wide use environment temperature range can be realized.

In addition, according to still another aspect of the invention, there is provided a liquid ejecting apparatus that includes the liquid ejecting head according to the above-described aspect.

In this case, since the piezoelectric element does not contain lead, an environmental burden can be reduced, and the liquid ejecting apparatus equipped with a liquid ejecting head that includes a piezoelectric element that can maintain excellent characteristics in a wide use environment temperature range can be realized.

In addition, according to still another aspect of the invention, there is provided an ultrasonic sensor that includes a vibrating unit that transmits a displacement to the outside which is caused due to driving of the piezoelectric element according to the above-described aspect and a matching layer that transmits a generated pressure wave to the outside.

In this case, since the piezoelectric element does not contain lead, an environmental burden can be reduced, and the ultrasonic sensor equipped with a piezoelectric element that can maintain excellent characteristics in a wide use environment temperature range can be realized.

In addition, according to still another aspect of the invention, there is provided a piezoelectric motor that includes at least a vibrator in which the piezoelectric element according to the above-described aspect is arranged, and a moving body contacting the vibrator.

In this case, since the piezoelectric element does not contain lead, an environmental burden can be reduced, and the piezoelectric motor equipped with a piezoelectric element that can maintain excellent characteristics in a wide use environment temperature range can be realized.

In addition, according to still another aspect of the invention, there is provided a power generator that includes an electrode for taking out a charge generated by the piezoelectric element according to the above-described aspect from the electrode.

In this case, since the piezoelectric element does not contain lead, an environmental burden can be reduced, and the power generator equipped with a piezoelectric element that can maintain excellent characteristics in a wide use environment temperature range can be realized.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Figure 1:
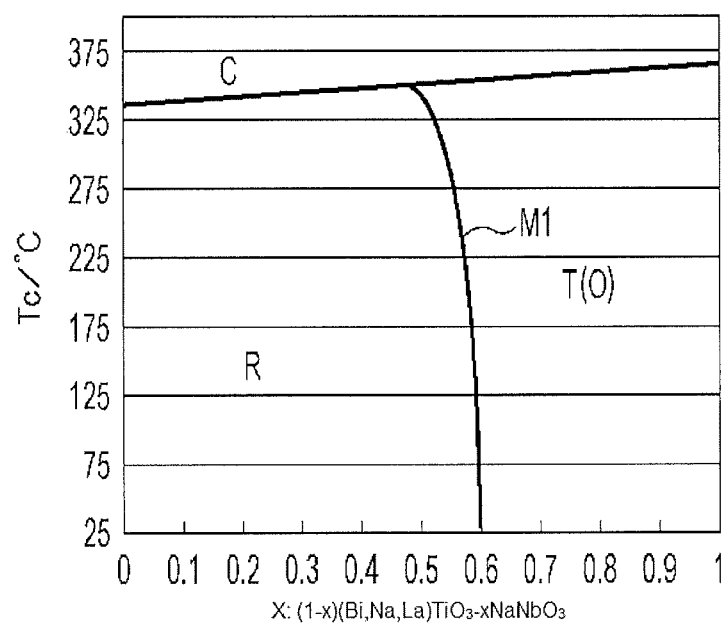
FIG. 1 is a graph plotting an example of a phase diagram for describing a piezoelectric material according to an aspect of the invention.

Hereinafter, the invention will be described in detail based on embodiments.

Piezoelectric Material

A piezoelectric material contains a first component that is a rhombohedral crystal in a single composition and that is configured to have a complex oxide with a perovskite structure and Curie temperature is set to be Tc1 and a second component that is a crystal other than the rhombohedral crystal in a single composition and that is configured to have a complex oxide with the perovskite structure and Curie temperature is set to be Tc2, and the absolute value of the difference between Tc1 and Tc2 |Tc1−Tc2| is equal to or lower than 50° C.

With the piezoelectric material which is obtained by forming a solid solution of the first component and the second component which satisfy the above condition, an MPB line can be made substantially vertically erect in a phase diagram that employs a composition ratio of the first component and the second component for the horizontal axis and temperature for the vertical axis.

Here, the first component is the rhombohedral crystal and is a complex oxide with the perovskite structure and has a relatively high Curie temperature, and for example, (Bi, Na, La)$TiO_3$, (Bi, Na, Ba)$TiO_3$, (Bi, Na)$TiO_3$, and (Bi, Na, Ba)$TiO_3$ to which Ca is added, (Bi, La) (St, Ti)$O_3$, and (Bi, Na)(Sc, Ti)$O_3$, Bi(FeMn)$O_3$, and the like can be exemplified.

The second component is a crystal other than the rhombohedral crystal, in other words, a tetragonal crystal or an orthorhombic crystal, and has a relatively high Curie temperature, and NaNbO$_3$, (K, Na)NbO$_3$, (Bi, K)TiO$_3$, and NaTaO$_3$ to which at least one kind selected from Li and Ta is added, and the like can be exemplified.

Here in a phase diagram that employs a composition ratio of the first component and the second component for the horizontal axis and temperature for the vertical axis, a line connecting Tc1 of the first component that is the rhombohedral crystal and Tc2 of the second component of a crystal other than the rhombohedral crystal, for example, a tetragonal crystal is positioned substantially in parallel to the axis of the composition ratio. This is because the composition is of a solid solution of the first component and the second component of which the absolute value of the difference between Tc1 and Tc2 |Tc1−Tc2| is equal to or lower than 50° C.

Thus, by using the composition along the MPB line, a piezoelectric material of which Curie temperature of the composition is equal to or higher than 280° C. and which can maintain almost constant characteristics even when temperature of a use environment changes can be realized.

As described above, the composition of the piezoelectric material is a composition in which the first component and the second component forms a solid solution as described above, a composition near the MPB line in the phase diagram that employs a composition ratio of the first component and the second component for the horizontal axis and temperature for the vertical axis, and Curie temperature of the composition Tc3 is preferably equal to or higher than 280° C.

Here, the MPB line is a boundary for creating different crystal systems, a crystal system has composition dependency, and a dielectric constant, a piezoelectric constant, and a Young's modulus have composition dependency. Thus, in a composition that forms the MPB line, a dielectric constant and a piezoelectric constant have a maximum value, and a Young's modulus has a minimum value. A composition region is defined for a dielectric constant and a piezoelectric constant in which the characteristics are exhibited within the range of 70% or more of a peak value (a value on the MPB), and a composition region for a Young's modulus in which the characteristic is within the range of 130% of the minimum value as compositions near MPB.

Here, the relationship of |Tc1−Tc2|/|Tc1+Tc2|≤0.1 is preferably satisfied. With the relationship, the absolute value of the difference between Tc1 and Tc2 |Tc1−Tc2| is within a predetermined range, and preferably, Curie temperature of the composition Tc3 is assuredly equal to or higher than 280° C.

Here, it is preferable that the molar ratio of the first component to (the first component+the second component) be equal to or higher than 0.1 and equal to or lower than 0.9. By appropriately selecting the first component and the second component, a piezoelectric material that has a high Curie temperature Tc3, or preferably 280° C. or higher in a wide composition range and can maintain characteristics almost constant even when temperature of a use environment changes can be realized.

Examples of each of the first component and the second component which can be applied to the piezoelectric material of the invention are shown below.

For example, the first component is (Bi, Na, La)TiO$_3$ and the second component is NaNbO$_3$.

In addition, the first component is (Bi, Na, La)TiO$_3$ and the second component is (K, Na)NbO$_3$ to which at least one kind selected from Li and Ta is added.

In addition, the first component is (Bi, Na, La)TiO$_3$ and the second component is (Bi, K)TiO$_3$.

In addition, the first component is one kind selected from (Bi, Na, Ba)TiO$_3$, (Bi, Na)TiO$_3$, (Bi, Na, Ba)TiO$_3$ to which Ca is added, (Bi, La)(St, Ti)O$_3$ and (Bi, Na)(Sc, Ti)O$_3$, and the second component is (K, Na)NbO$_3$ to which at least one kind selected from Li and Ta is added.

Hereinbelow, description will be provided in more detail with specific examples.

FIG. 1 illustrates a phase diagram that employs a composite ratio of a second component to a sum of a first component and a second component for the horizontal axis and temperature for the vertical axis when the first component is (Bi, Na, La)TiO$_3$ and the second component is NaNbO$_3$. In this case, Curie temperature Tc of (Bi, Na, La)TiO$_3$ that is the first component is 335° C., Curie temperature of NaNbO$_3$ that is the second component is 365° C., the MPB line M1 is substantially vertically erect, and a composition ratio of (Bi, Na, La)TiO$_3$ the second component merely changes in the range of 0.6 to 0.5. In addition, Curie temperature Tc3 at the peak of the MPB line M1 is 330° C. Accordingly, a piezoelectric material that has a remarkable piezoelectric characteristic and dielectric characteristic in a wide use environment temperature range and has a high Curie temperature can be realized.

Figure 2:
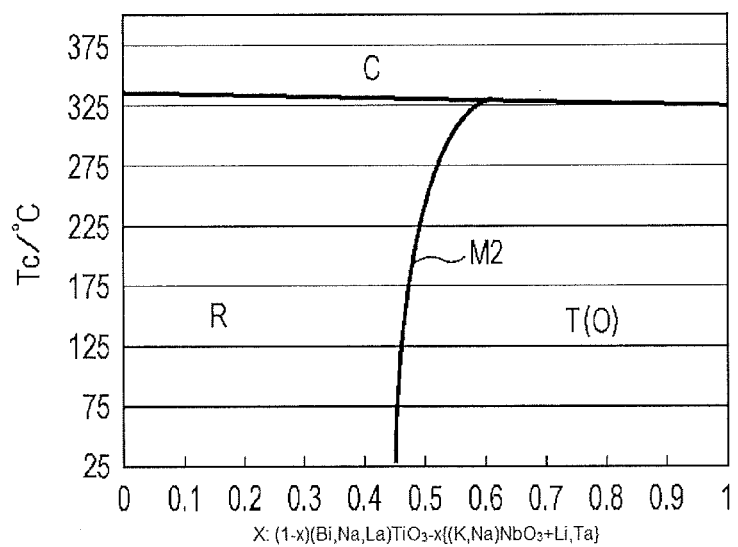
FIG. 2 is a graph plotting an example of a phase diagram for describing the piezoelectric material according to the aspect of the invention.

FIG. 2 illustrates a phase diagram that employs a composition ratio of a second component to a sum of a first component and a second component for the horizontal axis and temperature for the vertical axis when the first component is (Bi, Na, La)TiO$_3$ and the second component is (K, Na)NbO$_3$ to which at least one of Li and Ta is added. In this case, Curie temperature of (Bi, Na, La)TiO$_3$ that is the first component is 335° C., Curie temperature Tc of the second component is 325° C., the MPB line M2 is substantially vertically erect, a composition ratio of the second component merely changes in the range of 0.46 to 0.63. In addition, Curie temperature Tc3 at the peak of the MPB line M2 is 330° C. Accordingly, a piezoelectric material that has a remarkable piezoelectric characteristic and dielectric characteristic in a wide use environment temperature range and has a high Curie temperature can be realized.

Figure 3:
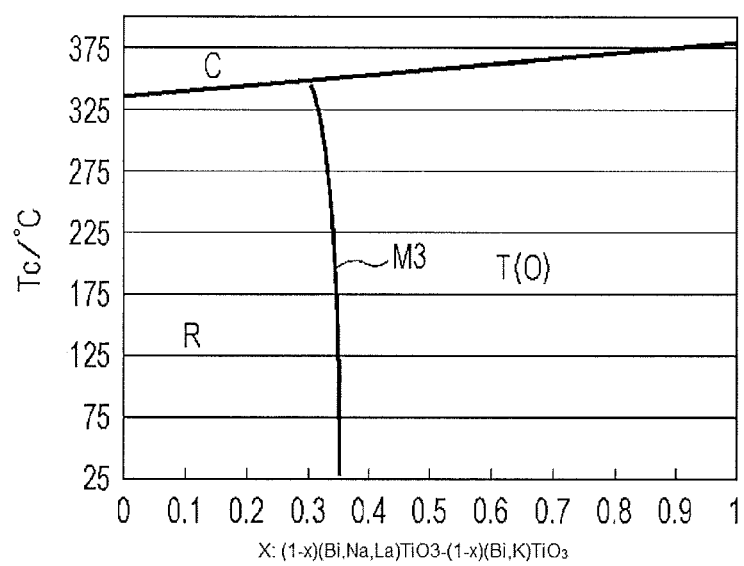
FIG. 3 is a graph plotting an example of a phase diagram for describing the piezoelectric material according to the aspect of the invention.

FIG. 3 illustrates a phase diagram that employs a composition ratio of a second component to a sum of a first component and a second component for the horizontal axis and temperature for the vertical axis when the first component is (Bi, Na, La)TiO$_3$ and the second component is (Bi, K)TiO$_3$. In this case, Curie temperature Tc of (Bi, Na, La)TiO$_3$ that is the first component is 335° C., Curie temperature Tc of (Bi, K)TiO$_3$ that is the second component is 380° C., the MPB line M3 is substantially vertically erect, and a composition ratio of the second component merely changes in the range of 0.35 to 0.31. In addition, Curie temperature Tc3 at the peak of the MPB line M3 is 347° C. Accordingly, a piezoelectric material that has a remarkable piezoelectric characteristic and dielectric characteristic in a wide use environment temperature range and has a high Curie temperature can be realized.

Although not shown in the drawings, even when the first component is (Bi, Na, Ba)TiO$_3$, (Bi, Na)TiO$_3$, and one kind selected from (Bi, Na, Ba)TiO$_3$ to which Ca is added, (Bi, La)(St, Ti)O$_3$, and (Bi, Na)(Sc, Ti)O$_3$, and the second component is (K, Na) NbO$_3$ to which at least one kind selected from Li and Ta is added, a phase diagram similar to FIGS. 1 to 3 is obtained, the MPB line is substantially vertically erect, and a piezoelectric material that has a remarkable piezoelectric characteristic and dielectric characteristic in a wide use environment temperature range and has a high Curie temperature can be realized. Here, in FIGS. 1 to 3, the phase diagram includes a composition range (denoted by R in the drawing) formed as a rhombohedral crystal, a composition range formed as a tetragonal crystal (denoted by T in the drawing) or an orthorhombic crystal (denoted by O in the drawing), and a composition range formed as a cubical crystal (denoted by C in the drawing).

When the piezoelectric element is used as an actuator, the range of the piezoelectric characteristics d33 is preferably 100 to 300 pC/N, and more preferably 150 to 300 pC/N. In this case, the range of a Young's modulus is preferably 30 to 80 GPa, and the range of Curie temperature Tc is preferably 70 to 350° C. and more preferably 100 to 300° C. In addition, the range of relative permittivity is preferably equal to or less than 2000 and more preferably 100 to 1000.

In addition, when the piezoelectric element is used as a sensor, the range of an e constant is preferably 3 to 15 C/m$^2$ and more preferably 5 to 15 C/m$^2$. In addition, in this case, the range of a Young's modulus is preferably 70 to 150 GPa and more preferably 80 to 130 GPa. In addition, the range of Curie temperature Tc is preferably 100 to 350° C. and more preferably 120 to 300° C. In addition, the range of relative permittivity is preferably equal to or less than 2000 and more preferably 100 to 800.

Piezoelectric Element and Liquid Ejecting Head

Figure 4:
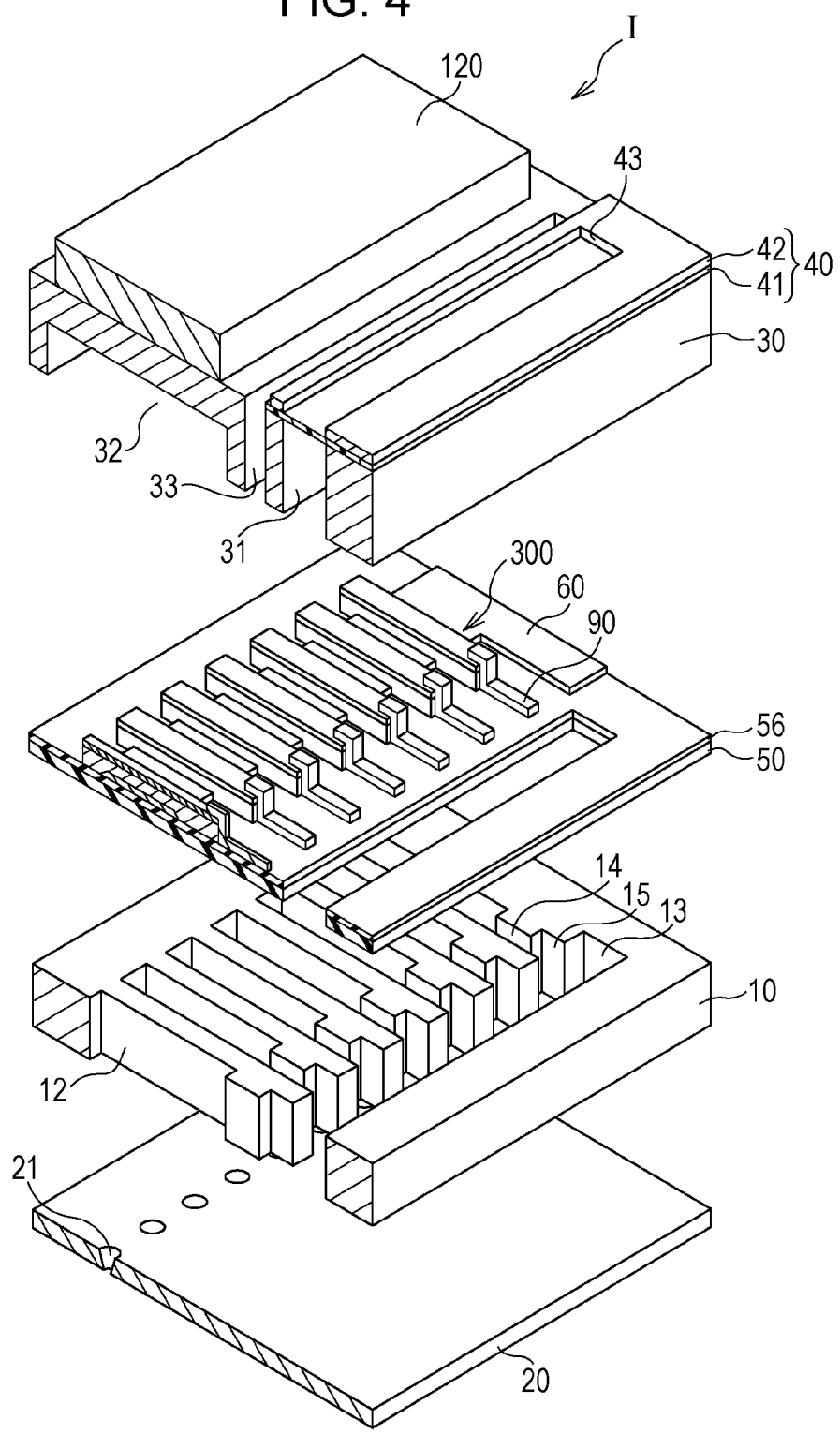
FIG. 4 is an exploded perspective view illustrating a schematic configuration of a recording head according to a first embodiment of the invention.
Figure 5:
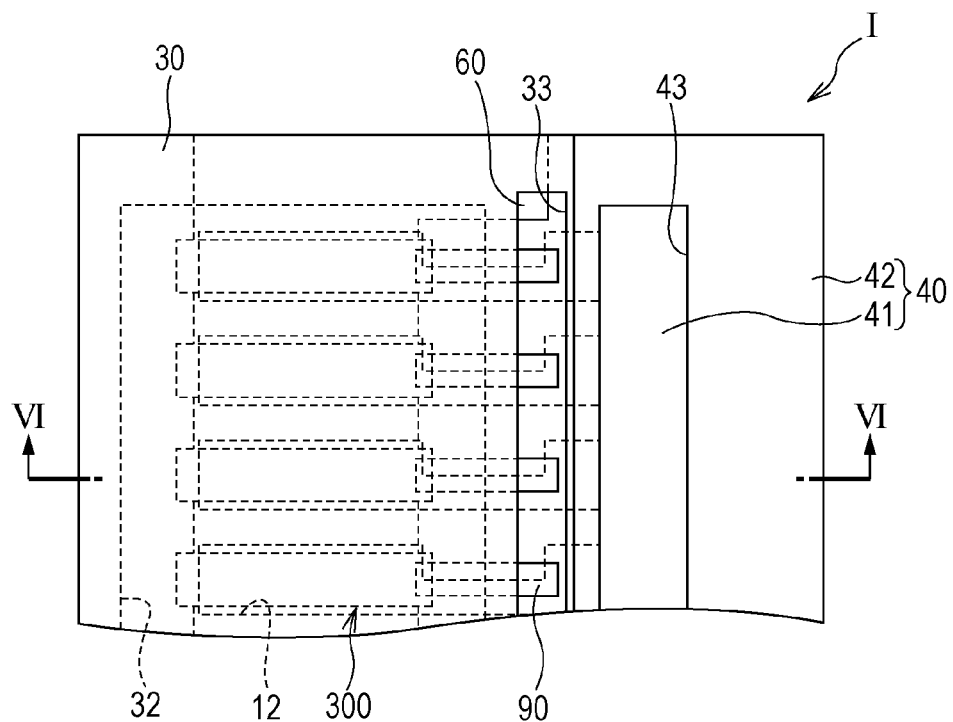
FIG. 5 is a plan view of the recording head according to the first embodiment of the invention.
Figure 6:
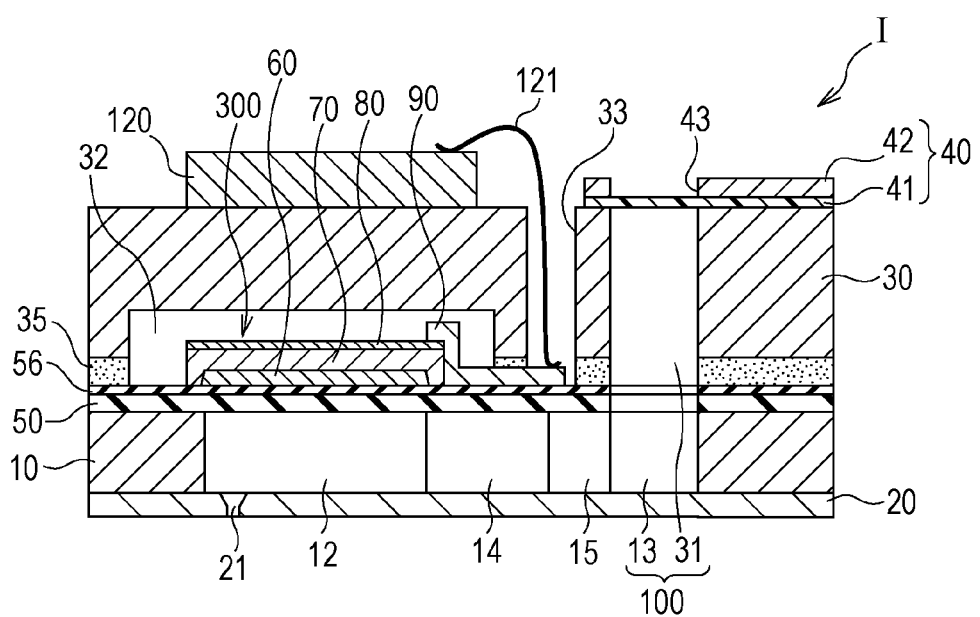
FIG. 6 is a cross-sectional view of the recording head according to the first embodiment of the invention.

FIG. 4 is an exploded perspective view illustrating a schematic configuration of an ink jet type recording head that is an example of a liquid ejecting head equipped with the piezoelectric element according to an embodiment of the invention. FIG. 5 is a plan view of FIG. 4, and FIG. 6 is a cross-sectional view taken by cutting along the line VI-VI of FIG. 5. As illustrated in FIGS. 4 to 6, a flow path forming substrate 10 of the present embodiment is constituted by a silicon monocrystal substrate, and an elastic film 50 configured to have silicon dioxide is formed on one face of the substrate.

A plurality of pressure generating chambers 12 are provided in parallel in the flow path forming substrate 10 in the width direction of the substrate. In addition, a communication unit 13 is formed in an outer region of the pressure generating chambers 12 in the longitudinal direction of the flow path forming substrate 10, and the communication unit 13 and each of the pressure generating chambers 12 communicate with each other via ink supply paths 14 and communication paths 15 provided for each of the pressure generating chambers 12. The communication unit 13 constitutes a part of a manifold that serves as an ink chamber shared by the pressure generating chambers 12 by communicating with a manifold unit 31 of a protection substrate to be described later. The ink supply paths 14 are formed having widths narrower than the pressure generating chambers 12, and keeps resistance of ink flowing from the communication unit 13 to the pressure generating chambers 12 against the flow path constant. Note that, in the present embodiment, the ink supply paths 14 are formed by narrowing the width of the flow path from a single side, but the ink supply paths may be formed by narrowing the width of the flow path from both sides. In addition, the ink supply paths may be formed not by narrowing the width of the flow path but by narrowing the width in the thickness direction thereof. In the present embodiment, a liquid flow path constituted by the pressure generating chambers 12, the communication unit 13, the ink supply paths 14, and the communication paths 15 is provided in the flow path forming substrate 10.

In addition, a nozzle plate 20 in which nozzle openings 21, which communicate with the pressure generating chambers 12 near the edge on the opposite side of the ink supply paths 14, are drilled is fixed to the flow path forming substrate 10 on the opening face side using an adhesive, a thermal welding film, or the like. Note that the nozzle plate 20 is formed of, for example, glass ceramics, silicon monocrystal substrate, stainless steel, or the like.

On the other hand, on the opposite side of the opening face of the flow path forming substrate 10, the elastic film 50 described above is formed, and an adhesive layer 56 that is formed of titanium oxide for improving adhesiveness to a base of first electrodes 60 such as the elastic film 50 is provided on the elastic film 50. Note that an insulating film formed of zirconium oxide may be formed between the elastic film 50 and the adhesive layer 56 if necessary.

Further, the first electrodes 60, a piezoelectric layer 70 which is a thin film having a thickness being equal to or thinner than 2 μm, or preferably 0.3 to 1.5 μm, and second electrodes 80 are formed on the adhesive layer 56 in a laminating manner, configuring piezoelectric elements 300. Here, the piezoelectric element 300 refers to a portion including the first electrodes 60, the piezoelectric layer 70, and the second electrodes 80. Generally, one electrode of the electrodes of the piezoelectric elements 300 is set to be a shared electrode, and the other electrode and the piezoelectric layer 70 are patterned for each of the pressure generating chambers 12. In the present embodiment, each of the first electrodes 60 is set to be a shared electrode of the piezoelectric elements 300, and each of the second electrodes 80 is set to be an independent electrode of the piezoelectric elements 300, but it does not matter to reverse the setting according to a state of a drive circuit or a wiring. In addition, here, the piezoelectric elements 300 and a diaphragm of which displacement is caused due to driving of the piezoelectric elements 300 are referred to as actuator devices. Note that, in the example described above, the elastic film 50, the adhesive layer 56, the first electrodes 60, and an insulating film provided if necessary act as a diaphragm, but it is of course not limited thereto, and for example, the elastic film 50 or the adhesive layer 56 may not be provided. In addition, the piezoelectric elements 300 may also serve as a substantial diaphragm by itself.

In the present embodiment, the piezoelectric layer 70 is formed of the piezoelectric material described above. Since the piezoelectric material has a remarkable piezoelectric characteristic and dielectric characteristic in a wide use environment temperature range and has high Curie temperature, a piezoelectric element that exhibits an excellent displacement characteristic in a wide use environment temperature range can be realized. In addition, since the piezoelectric material does not contain lead, an environmental burden can be reduced.

Each of the second electrodes 80 that is an independent electrode of the piezoelectric elements 300 is drawn out from a periphery of an end of the ink supply path 14, and is connected to each of leading electrodes 90 that is formed of, for example, gold (Au), or the like, extending onto the adhesive layer 56.

With the flow path forming substrate 10 on which the piezoelectric elements 300 are formed as described above, in other words, on the first electrodes 60, the adhesive layer 56, and the leading electrodes 90, a protection substrate 30 that has the manifold unit 31 constituting at least a part of a manifold 100 is bonded via an adhesive 35. The manifold unit 31 is formed passing through of the protection substrate 30 in the thickness direction thereof to the pressure generating chambers 12 in the width direction thereof, and communicates with the communication unit 13 of the flow path forming substrate 10 described above, thereby constituting the manifold 100 that serves as a shared ink chamber of the pressure generating chambers 12 in the present embodiment. In addition, by dividing the communication unit 13 of the flow path forming substrate 10 into a plural number for each pressure generating chamber 12, only the manifold unit 31 may set to be a manifold. Further, for example, it may be configured that only the pressure generating chambers 12 are provided in the flow path forming substrate 10, and the ink supply path 14 that communicates with the manifold 100 and the pressure generating chambers 12 may be provided for a member (for example, the elastic film 50, the adhesive layer 56, or the like) that is interposed between the flow path forming substrate 10 and the protection substrate 30.

In addition, in a region of the protection substrate 30 facing the piezoelectric elements 300, a piezoelectric element holding unit 32 that has a space large enough for not disrupting motions of the piezoelectric elements 300 is provided. The piezoelectric element holding unit 32 preferably has a space large enough for not disrupting motions of the piezoelectric elements 300, and the space may or may not be sealed.

As the protection substrate 30 described above, a material having substantially the same thermal expansion coefficient as the flow path forming substrate 10, for example, glass, a ceramic material, or the like is preferably used, and in the present embodiment, the projection substrate is formed using a silicon monocrystal substrate that is the same material as the flow path forming substrate 10.

In addition, a through hole 33 passing through the protection substrate 30 in the thickness direction is provided in the protection substrate 30. In addition, a part of an end of the leading electrode 90 drawn from each of the piezoelectric elements 300 is provided so as to be exposed within the through hole 33.

In addition, a drive circuit 120 for driving the piezoelectric elements 300 which are installed parallel to each other is fixed onto the protection substrate 30. As the drive circuit 120, for example, a circuit board, a semiconductor integrated circuit (IC), or the like can be used. In addition, the drive circuit 120 and the leading electrode 90 are electrically connected to each other via connection wiring 121 formed of conductive wires such as bonding wires.

In addition, a compliance substrate 40 that includes a sealing film 41 and a fixing plate 42 is bonded with the protection substrate 30. Here, the sealing film 41 is formed of a flexible material having low rigidity, and one face of the manifold unit 31 is sealed by the sealing film 41. In addition, the fixing plate 42 is formed of a relatively hard material. Since a region of the fixing plate 42 facing the manifold 100 forms an opening 43 which is completely removed in the thickness direction, one face of the manifold 100 is sealed only by the flexible sealing film 41.

In an ink jet type recording head I of the present embodiment, ink is taken from an ink inlet connected to an external ink supply unit that is not shown in the drawing, the inside from the manifold 100 to nozzle openings 21 is filled with ink, then a voltage is applied to spaces between the first electrodes 60 and the second electrodes 80 each of which is corresponding to the pressure generating chambers 12 according to a recording signal from the drive circuit 120, accordingly, the elastic film 50, the adhesive layer 56, the first electrodes 60, and the piezoelectric layer 70 are deflected, which causes pressure inside each of the pressure generating chambers 12 to increase, and consequently ink drops are discharged from the nozzle openings 21.

Next, an example of a method for manufacturing the piezoelectric element of the ink jet type recording head of the present embodiment will be described.

First, a silicon dioxide film formed of silicon dioxide ($SiO_2$), or the like constituting the elastic film 50 is formed on a surface of a wafer 110 for a flow path forming substrate that is a silicon wafer using thermal oxidation. Next, the adhesive layer 56 formed of titanium oxide, or the like is formed on the elastic film 50 (silicon dioxide film) using a reactive sputtering method, thermal oxidation, or the like.

Next, the first electrodes 60 are formed on the adhesive layer 56. To be specific, the first electrodes 60 that is formed of platinum, indium, indium oxide, a staked structure thereof, or the like is formed on the adhesive layer 56. Note that the adhesive layer 56 and the first electrodes 60 can be formed using, for example, a sputtering method or a vapor deposition method.

Next, the piezoelectric layer 70 is laminated on the first electrode 60. A manufacturing method of the piezoelectric layer 70 is not particularly limited, but for example, the piezoelectric layer 70 can be formed using a chemical solution method such as a Metal-Organic Decomposition (MOD) method or a gel-sol method in which a solution obtained by dissolving or dispersing an organic metal compound in a solvent is applied, dried, and then burned at a high temperature, and thereby the piezoelectric layer 70 formed of metal oxide is obtained. The piezoelectric layer 70 may be formed using other methods of a laser ablation method, the sputtering method, a pulsed laser deposition method (PLD method), a CVD method, an aerosol deposition method, or the like.

When the piezoelectric layer 70 is formed using, for example, a chemical application method, 2-ethylhexanoate, acetate containing desired elements are used as starting materials. For example, there are bismuth 2-ethylhexanoate, barium 2-ethylhexanoate, iron 2-ethylhexanoate, titanium 2-ethylhexanate, and the like. A precursor solution is prepared by mixing n-octane solutions of the raw materials, and adjusting molar ratios of metal elements so as to match with a stoichiometric ratio. Then, a piezoelectric film is formed using a spin coating method in which the precursor solution is dropped onto a bottom electrode that is produced beforehand, rotated for 6 seconds at 500 rpm, and then a substrate is rotated for 20 seconds at 3000 rpm. Next, the substrate is placed on a hot plate, and dried for 2 minutes at 180° C. Next, the substrate is placed on the hot plate, and then degreasing is performed for 2 minutes at 350° C. After repeating the process from solution application to degreasing twice, the substrate is fired for 5 minutes at 750° C. using an RTA device in an oxygen atmosphere. Then, the process is repeated five times, and thereby a piezoelectric layer 70 can be formed through a total of 10 times of application.

After the piezoelectric layer 70 is formed as described above, the second electrodes 80 formed of platinum, or the like is formed on the piezoelectric layer 70 using the sputtering method, or the like, the piezoelectric layer 70 and the second electrodes 80 are patterned at the same time in a region facing each of the pressure generating chambers 12, and thereby the piezoelectric elements 300 configured to have the first electrodes 60, the piezoelectric layer 70, and the second electrodes 80 are formed. Note that the patterning of the piezoelectric layer 70 and the second electrode 80 can be collectively performed using dry etching via a resist (not shown in the drawing) that is formed in a predetermined shape. Then, post annealing may be performed in a temperature range of 600° C. to 800° C. if necessary. Accordingly, a favorable interface between the piezoelectric layer 70 and the first electrodes 60 or the second electrodes 80 can be formed, and a crystalline property of the piezoelectric layer 70 can improve.

Next, over the entire face of the wafer for a flow path forming substrate, the leading electrodes 90 formed of, for example, gold (Au), or the like are formed, and then, the electrodes are patterned for each of the piezoelectric elements 300 via, for example, a mask pattern that includes a resist, or the like.

Next, after a wafer for a protection substrate that is a silicon wafer and will serve as a plurality of the protection substrates 30 is bonded with the piezoelectric elements 300 of the wafer for a flow path forming substrate using the adhesive 35, the wafer for a flow path forming substrate is thinned so as to have a predetermined thickness.

Next, a mask film is newly formed on the wafer for the flow path forming substrate, and patterned in a predetermined shape.

Then, by performing anisotropic etching (wet etching) on the wafer for a flow path forming substrate using an alkali solution such as KOH via the mask film, the pressure generating chambers 12, the communication unit 13, the ink supply path 14, and the communication path 15 corresponding to the piezoelectric elements 300 are formed.

Then, unnecessary portions of outer circumferential parts of the wafer for a flow path forming substrate and the wafer for a protection substrate are cut so as to be removed using, for example, dicing, or the like. Then, after the mask film 52 of the face of the wafer for a flow path forming substrate on the opposite side of the wafer for a protection substrate is removed, the nozzle plate 20 through which the nozzle openings 21 are drilled is bonded with the wafer for a flow path forming substrate, the compliance substrate 40 is bonded with the wafer for a protection substrate, and then by dividing the wafer for a flow path forming substrate into one-chip-sized flow path forming substrate 10, and the like as shown in FIG. 4, the ink jet type recording head I of the present embodiment is formed.

Example 1

$(Bi_{0.5}, Na_{0.4}, La_{0.1})TiO_3$ was selected as the first component, $NaNbO_3$ was selected as the second component, and a piezoelectric material having a composition in which the molar ratio of both components is 0.60:0.40 was formed as described below.

A precursor solution was prepared by mixing n-octane solutions of bismuth 2-ethylhexanoate, sodium 2-ethylhexanoate, lanthanum 2-ethylhexanoate, titanium 2-ethylhexanoate, and niobium 2-ethylhexanoate as starting materials by adjusting the molar ratio of the metal elements so as to match with a stoichiometric ratio of the composition.

A piezoelectric film was formed using a spin coating method in which the precursor solution was dropped onto a bottom electrode that had been produced beforehand, rotated for 6 seconds at 500 rpm, and then a substrate was rotated for 20 seconds at 3000 rpm. Next, the substrate was placed on a hot plate and dried for 2 minutes at 180° C. Then, the substrate was placed on the hot plate to perform degreasing for 2 minutes at 350° C. After repeating the process from solution application to degreasing twice, the substrate was burned for 5 minutes at 750° C. using an RTA device in an oxygen atmosphere. Then, the process was repeated five times, and thereby a piezoelectric layer was formed through a total of 10 times of application.

A head with the structure described above was configured using piezoelectric elements formed using the piezoelectric layer. d33 of the piezoelectric element was 180 pC/N, and a Young's modulus thereof was 77 GPa. Curie temperature Tc was 330° C. Thus, when a piezoelectric element, particularly an actuator using the piezoelectric material is configured, it can be easily anticipated that significant displacement is obtained.

Example 2

$(Bi_{0.5}, Na_{0.4}, La_{0.1})TiO_3$ was selected as the first component, $(K_{0.5}, Na_{0.5})NbO_3$ to which at least one element selected from Li and Ta had been added was selected as the second component, and a piezoelectric material having a composition in which the molar ratio of both components is 0.45:0.55 was formed as described below.

A precursor solution was prepared by mixing n-octane solutions of bismuth 2-ethylhexanoate, sodium 2-ethylhexanoate, lanthanum 2-ethylhexanoate, titanium 2-ethylhexanoate, potassium 2-ethylhexanoate, niobium 2-ethylhexanoate, lithium 2-ethylhexanoate, and tantalum 2-ethylhexanoate as starting materials by adjusting the molar ratio of the metal elements so as to match with a stoichiometric ratio of the composition.

A piezoelectric film was formed using the spin coating method in which the precursor solution was dropped onto a bottom electrode that had been produced beforehand, rotated for 6 seconds at 500 rpm, and then a substrate was rotated for 20 seconds at 3000 rpm. Next, the substrate was placed on a hot plate and dried for 2 minutes at 180° C. Then, the substrate was placed on the hot plate to perform degreasing for 2 minutes at 350° C. After repeating the process from solution application to degreasing twice, the substrate was burned for 5 minutes at 750° C. using an RTA device in an oxygen atmosphere. Then, the process was repeated five times, and thereby a piezoelectric layer was formed through a total of 10 times of application.

A head with the structure described above was configured using piezoelectric elements formed using the piezoelectric layer. d33 of the piezoelectric element was 220 pC/N, and a Young's modulus thereof was 70 GPa. In addition, Curie temperature Tc4 was 330° C. Thus, when the piezoelectric element, particularly an actuator using the piezoelectric material is configured, it can be easily anticipated that significant displacement is obtained.

Example 3

$(Bi_{0.5}, Na_{0.4}, La_{0.1})TiO_3$ was selected as the first component, $(Bi_{0.5}, K_{0.5})TiO_3$ was selected as the second component, and a piezoelectric material having a composition in which the molar ratio of both components is 0.33:0.67 was formed as described below.

A precursor solution was prepared by mixing n-octane solutions of bismuth 2-ethylhexanoate, sodium 2-ethylhexanoate, lanthanum 2-ethylhexanoate, titanium 2-ethylhexanoate, and potassium 2-ethylhexanoate as starting materials by adjusting the molar ratio of the metal elements so as to match with a stoichiometric ratio of the composition.

A piezoelectric film was formed using the spin coating method in which the precursor solution was dropped onto a bottom electrode that had been produced beforehand, rotated for 6 seconds at 500 rpm, and then a substrate was rotated for 20 seconds at 3000 rpm. Next, the substrate was placed on a hot plate and dried for 2 minutes at 180° C. Then, the substrate was placed on the hot plate to perform degreasing for 2 minutes at 350° C. After repeating the process from solution application to degreasing twice, the substrate was burned for 5 minutes at 750° C. using an RTA device in an oxygen atmosphere. Then, the process was repeated five times, and thereby a piezoelectric layer was formed through a total of 10 times of application.

A head with the structure described above was configured using piezoelectric elements formed using the piezoelectric layer. d33 of the piezoelectric element was 270 pC/N, and a Young's modulus thereof was 75 GPa. In addition, Curie temperature Tc4 was 347° C. Thus, when the piezoelectric element, particularly an actuator using the piezoelectric material is configured, it can be easily anticipated that significant displacement is obtained.

Example 4 and Other Embodiment

One of (Bi0.5, Na0.4, Ba0.1)TiO$_3$, (Bi0.5, Na0.5)TiO$_3$, (Bi0.5, Na0.5)TiO$_3$ to which Ca is added, (Bi0.7, La0.3) (Sc0.1, Ti0.9)O$_3$[M] and (Bi0.7, La0.3)(Zn0.2, Ti0.8)O$_3$ were selected as the first component and NaNbO$_3$ to which at least one element selected from Li and Ta was selected as the second component, and then a piezoelectric material was formed as follows. The molar ratio of the first components and the second components was decided based on an MPB that is defined at a point at which dependency of a dielectric constant on a composition ratio becomes the maximum and a point at which a Young's modulus becomes the minimum.

As a starting material, 2-ethylhexanoate was employed. An n-octane solution was employed as a solvent, they were mixed by adjusting the molar ratio of the metal elements so as to match with a stoichiometric ratio of the composition, and accordingly, a precursor solution was prepared.

An MPB is not always formed only in a combination of a rhombohedral crystal and a tetragonal crystal. Although there are differences in the effect of the MPB, there are the following combination cases.

I Tetragonal system and orthorhombic system
II Tetragonal system and monoclinic system
III Orthorhombic system and monoclinic system Table 1 describes compositions (A site and B site) composing a perovskite-type crystal (ABO$_3$ wherein A and B are metal elements), crystal systems, and Curie temperature Tc thereof. The elements can be arbitrarily selected so that a combination of crystal systems different from Table 1 can be realized. In this case, Tc1 and Tc2, can be selected by adjusting an additive and an amount of addition. As elements appropriate for the additive, elements other than the elements described in Table 1 are exemplified below:

Mn, Ge, Si, B, Cu, and Ag.

TABLE 1

Composition, Tc, and Crystal System

| A SITE | B SITE | Tc | ADDITIVE | CRYSTAL SYSTEM (AT ROOM TEMPERATURE) |
|---|---|---|---|---|
| Ag | Nb | 67 | | M |
| Bi | NiTi | 225 | | M |
| Ba | HfTi | 25 | | R |
| Ba | SnTi | 50 | | R |
| Ba | ZrTi | 70 | | R |
| NaBi | Ti | 200 | | R |
| BiNa | Ti | 268 | Sr | R |
| BiNa | Ti | 268 | Ca | R |
| BiNaBa | Ti | 280 | | R |
| BiNa | Ti | 320 | | R |
| BiNa | Ti | 200~350 | Li, La | R |
| BiLa | ZnTi | 350 | | R |
| BiNa | ScTi | 358 | | R |
| Ag | Ta | 370 | | R |
| Ba | Bi | 370 | | R |
| Bi | MgTi | 395 | | R |
| Si | Sc | 400 | | R |
| Bi | Sc | 480 | | R |
| Bi | Fe | 850 | | R |
| BiNaLa | Ti | 335-370 | | R |
| K | Nb | 200~435 | Sr, Li, Sb, Ta | O |
| KNa | Nb | 200~435 | Sr, Li, Sb, Ta | O |
| Na | Nb | 365 | | O |
| Na | Ta | 480 | | O |
| Cd | Hf | 600 | | O |
| Sr | Zr | 700 | | O |
| Ca | Ti | 1260 | | O |
| BaCa | Ti | 70 | | T |
| Ba | Ti | 123 | | T |
| Na | Nb | 360 | | T |
| BiK | Ti | 380 | | T |

T: Tetragonal system
R: Rhombohedral system
M: Monoclinic system
O: Orthorhombic system

OTHER EMBODIMENT

Hereinabove, embodiments of the invention have been described, but a basic configuration of the invention is not limited to ones described above. Although, for example, a silicon monocrystal substrate is exemplified as the flow path forming substrate 10 in the embodiment described above, the configuration is not particularly limited thereto, and a material, for example, an SOI substrate, glass, or the like may be used.

Further, in the embodiment described above, although the piezoelectric elements 300 obtained by laminating the first electrodes 60, the piezoelectric layer 70, and the second electrodes 80 on a substrate (the flow path forming substrate 10) in order are exemplified, they are not particularly limited thereto, and the invention can also be applied to a longitudinal oscillation type piezoelectric element in which piezoelectric materials and electrode forming materials are laminated in an alternate manner and extend in an axial direction.

The piezoelectric layer may not be a thin film as described above, but may be a bulk member. When the layer is formed as a bulk member, carbonate or oxide is used as a starting material. Examples are K$_2$CO$_3$, Na$_2$CO$_3$, Nb$_2$O$_5$, and the like. The starting materials are measured so as to match with a stoichiometric ratio and then wet-blended with ethanol using a ball mill. After the obtained mixture is dried, it is calcined for 3 hours at 700° C. The calcined powder is pulverized and mixed using mortar with addition of an appropriate amount of PVA as a binder, and is caused to pass through a sieve of 150 mesh to adjust granularity thereof, and then the obtained powder is formed into a discoid pallet using a single-axis press device. Next, the formed pallet and residual calcined powder are put into a melting pot and burned for 3 hours at 1100° C., thereby obtaining a discoid oxide. Then, both faces of the obtained discoid oxide are polished so as to have surfaces, are coated with silver paste and burned, and accordingly, a piezoelectric body provided with silver electrodes can be obtained. Note that, in the manufacturing of the piezoelectric body in bulk, barium carbonate, titanium oxide, bismuth oxide, tin oxide, iron oxide, zirconium oxide, lanthanum oxide, lithium carbonate, and the like can be exemplified as starting materials.

Figure 7:
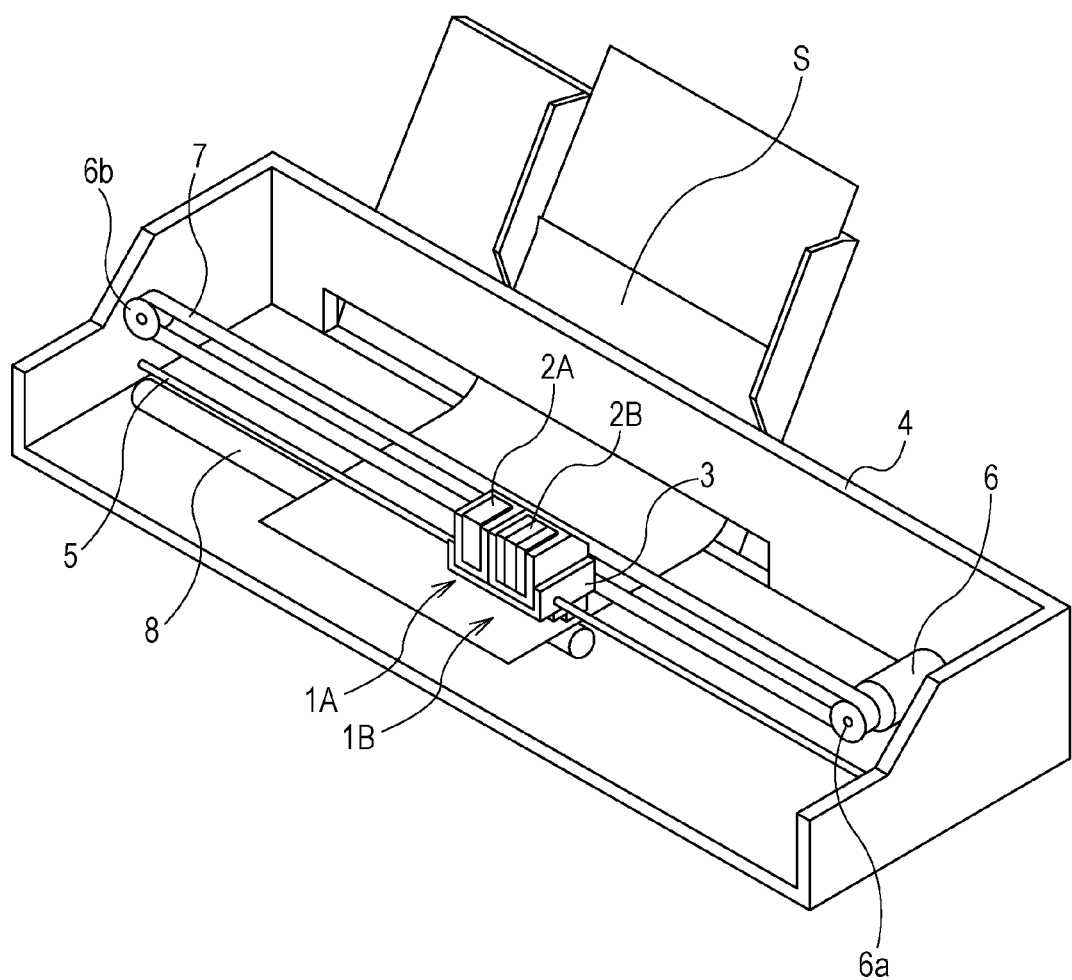
FIG. 7 is a diagram illustrating a schematic configuration of a recording apparatus according to an embodiment of the invention.

In addition, the ink jet type recording head of the embodiment constitutes a part of a recording head unit that includes an ink flow path that communicates with an ink cartridge, or the like, and is mounted in an ink jet type recording apparatus. FIG. 7 is a schematic diagram illustrating an example of such an ink jet type recording apparatus.

As illustrated in FIG. 7, recording head units 1A and 1B that have the ink jet type recording head I are provided so as to enable cartridges 2A and 2B constituting an ink supply unit to attach to and detach from the units, and a carriage 3 on which the recording head units 1A and 1B are mounted is provided so as to freely move on a carriage shaft 5 installed in the main body 4 of the apparatus in the axial direction. The recording head units 1A and 1B are respectively set to discharge, for example, a black ink composition and a color ink composition.

In addition, drive force of a drive motor 6 is transmitted to the carriage 3 via a plurality of gear wheels, which are not shown in the drawing, and a timing belt 7, and accordingly, the carriage 3 on which the recording head units 1A and 1B are mounted is moved along the carriage shaft 5. On the other hand, the main body 4 of the apparatus is provided with a platen 8 along the carriage shaft 5, and a recording sheet S that is a recording medium such as paper fed by a feeding roller, or the like, which is not shown in the drawing, is designed to be wounded around the platen 8 and then transported.

In the example illustrated in FIG. 7, although the ink jet type recording head units 1A and 1B are set to respectively have one ink jet type recording head I, they are not particularly limited thereto, and for example, either of the ink jet type recording head units 1A or 1B may have two or more ink jet type recording heads.

Note that, in the embodiment described above, the ink jet type recording head is exemplified as an example of a liquid ejecting head, however, the invention widely targets liquid ejecting heads in general, and can of course be applied to liquid ejecting heads that eject liquid other than ink. As other liquid ejecting heads, for example, various recording heads used in image recording apparatuses such as printers, color material ejecting heads used in manufacturing of color filters of liquid crystal displays, electrode material ejecting heads used in formation of electrodes of organic EL displays, field emission displays (FED), bioorganic substance ejecting heads used in manufacturing of bio chips, and the like can be exemplified.

Ultrasonic Sensor and Piezoelectric Motor

Since the above piezoelectric element exhibits a satisfactory insulating property and piezoelectric characteristic, it can be applied to a piezoelectric element of a liquid ejecting head represented by an ink jet-type recording head as described above, however, it is not limited thereto. Since the above piezoelectric element exhibits an excellent displacement characteristic, it is not limited to the liquid ejecting head represented by an ink jet-type recording head, it can be appropriately used by being mounted on liquid ejecting apparatuses, ultrasonic sensors, piezoelectric motors, ultrasonic motors, piezoelectric transformers, oscillation-type dust removal apparatuses, pressure-electric converters, ultrasonic wave transmitting machines, pressure sensors, acceleration sensors, or the like.

Power Generator

In addition, since the piezoelectric element exhibits a satisfactory energy-electric conversion capability, it can be appropriately used by being mounted on a power generator. Examples of the power generator include a power generator using a pressure-electric conversion effect, a power generator using an electronic excitation (photovoltaic power) by light, a power generator using an electronic excitation (thermo-electric force) by heat, and a power generator using oscillating.

Note that, the piezoelectric element can be appropriately used in pyroelectric device such as infrared detectors, terahertz detectors, temperature sensors, and thermo-sensitive sensors or ferroelectric elements such as a ferroelectric memory.

The entire disclosures of Japanese Patent Application Nos. 2013-137281 filed Jun. 28, 2013 and 2014-001902 filed Jan. 8, 2014 are expressly incorporated by reference herein.

What is claimed is:

1. A piezoelectric material containing:
   a first component that is a rhombohedral crystal that has a complex oxide with a perovskite structure and Curie temperature Tc1; and
   a second component that is a crystal other than a rhombohedral crystal has a complex oxide with the perovskite structure and Curie temperature Tc2,
   wherein the piezoelectric material is obtained by forming a solid solution of the first component and the second component, and an absolute value of a difference between Tc1 and Tc2 is equal to or less than 50° C.

2. The piezoelectric material according to claim 1, wherein a composition near an MPB line is provided in a phase diagram that employs a composition ratio of the second component to a sum of the first component and the second component for a horizontal axis and temperature for a vertical axis.

3. The piezoelectric material according to claim 1, wherein $|Tc1-Tc2|/|Tc1+Tc2| \leq 0.1$.

4. The piezoelectric material according to claim 1, wherein a Curie temperature of the material is equal to or higher than 280° C.

5. The piezoelectric material according to claim 1, wherein a molar ratio of the first component to (the first component + the second component) is 0.1 to 0.9.

6. The piezoelectric material according to claim 1, wherein the first component is (Bi, Na, La)$TiO_3$, and the second component is $NaNbO_3$.

7. The piezoelectric material according to claim 1, wherein the first component is (Bi, Na, La)$TiO_3$, and the second component is (K, Na)$NbO_3$ to which at least one of Li and Ta is added.

8. The piezoelectric material according to claim 1, wherein the first component is (Bi, Na, La)$TiO_3$, and the second component is (Bi, K)$TiO_3$.

9. The piezoelectric material according to claim 1, wherein the first component is one of (Bi, Na, Ba)$TiO_3$, (Bi, Na)$TiO_3$, (Bi, Na)$TiO_3$ to which Ca is added, (Bi, La)(Sc, Ti)$O_3$ and (Bi, La)(Zn, Ti)$O_3$, and the second component is $NaNbO_3$ to which at least one of Li and Ta is added.

10. A piezoelectric element comprising:
    a piezoelectric layer formed of the piezoelectric material according to claim 1; and
    an electrode provided on the piezoelectric layer.

11. A piezoelectric element comprising:
a piezoelectric layer formed of the piezoelectric material according to claim 2; and
an electrode provided on the piezoelectric layer.

12. A piezoelectric element comprising:
a piezoelectric layer formed of the piezoelectric material according to claim 3; and
an electrode provided on the piezoelectric layer.

13. A piezoelectric element comprising:
a piezoelectric layer formed of the piezoelectric material according to claim 4; and
an electrode provided on the piezoelectric layer.

14. A piezoelectric element comprising:
a piezoelectric layer formed of the piezoelectric material according to claim 5; and
an electrode provided on the piezoelectric layer.

15. A piezoelectric element comprising:
a piezoelectric layer formed of the piezoelectric material according to claim 6; and
an electrode provided on the piezoelectric layer.

16. A liquid ejecting head comprising:
a pressure generating chamber that communicates with a nozzle opening; and
a piezoelectric element that has a piezoelectric layer and an electrode provided on the piezoelectric layer,
wherein the piezoelectric layer is formed of the piezoelectric material according to claim 1.

17. A liquid ejecting apparatus comprising:
the liquid ejecting head according to claim 16.

18. An ultrasonic sensor comprising:
a vibrating unit that transmits a displacement which is caused due to driving of the piezoelectric element according to claim 10 to the outside; and
a matching layer that transmits a generated pressure wave to the outside.

19. A piezoelectric motor comprising:
at least a vibrator in which the piezoelectric element according to claim 10 is arranged, and a moving body contacting the vibrator.

20. A power generator comprising:
an electrode taking out a charge generated by the piezoelectric element according to claim 10.

21. The piezoelectric material according to claim 6, wherein a composition ratio of the first component is $(Bi_{0.5}, Na_{0.4}, La_{0.1})TiO_3$, and a molar ratio of the first component and the second component is 0.60:0.40.

22. The piezoelectric material according to claim 7, wherein a composition ratio of the first component is $(Bi_{0.5}, Na_{0.4}, La_{0.1})TiO_3$, and a molar ratio of the first component and the second component is 0.45:0.55.

23. The piezoelectric material according to claim 8, wherein a composition ratios of the first component is $(Bi_{0.5}, Na_{0.4}, La_{0.1})TiO_3$, and a molar ratio of the first component and the second component is 0.33:0.67.

* * * * *